United States Patent
Schmalenberg (10) Patent No.: US 10,950,638 B2
(45) Date of Patent: Mar. 16, 2021

(54) TUNABLE IMAGING SYSTEMS AND METHODS THEREOF

(71) Applicant: Toyota Motor Engineering & Manufacturing North America, Inc., Plano, TX (US)

(72) Inventor: Paul Schmalenberg, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 16/370,273

(22) Filed: Mar. 29, 2019

(65) Prior Publication Data

US 2020/0312895 A1 Oct. 1, 2020

(51) Int. Cl.
*H01L 27/146* (2006.01)
*H04N 5/341* (2011.01)
(Continued)

(52) U.S. Cl.
CPC ... *H01L 27/14605* (2013.01); *H04N 5/23229* (2013.01); *H04N 5/341* (2013.01); *H04N 5/37452* (2013.01)

(58) Field of Classification Search
CPC . H01L 27/14605; H01L 27/146–14893; H01L 27/14625–14629;
(Continued)

(56) References Cited

U.S. PATENT DOCUMENTS

| 7,135,698 B2 | 11/2006 | Mitra |
| 10,068,934 B2 | 9/2018 | Ogawa et al. |

(Continued)

FOREIGN PATENT DOCUMENTS

| WO | 2017210264 A1 | 12/2017 |
| WO | 2018045271 A1 | 3/2018 |
| WO | 2018089444 A1 | 5/2018 |

OTHER PUBLICATIONS

Xiangru Fang et al., Transforming monolayer transition-metal dichalcogenide nanosheets into one-dimensional nanoscrolls with high photosensitivity: ACS Appln. Mater. Interfaces 2018, 10, 15, 13011-13018.

(Continued)

*Primary Examiner* — Shahed Ahmed
(74) *Attorney, Agent, or Firm* — Dinsmore & Shohl LLP (57) ABSTRACT

An imaging system comprises a tuner and an image sensor including a plurality of pixel sensors. Each pixel sensor includes a photodetector, a stack of two or more filter layers comprising a given transition metal dichalcogenide (TMD), and one or more transparent glass layers positioned between adjacent filter layers. The stack selectively transmits received radiation to the photodetector based on a transmissivity of the filter layers, the transmissivity being based on a tuning context of the tuner. The imaging system sets the tuning context of the tuner and, for each of the pixel sensors, measures an intensity of radiation received from the stacks by the photodetector, determines a transmissivity of the stack based on both (i) the given TMD and (ii) the tuning context, and determines an intensity of radiation received by the pixel sensor at the stack based on the measured intensity and the determined transmissivity.

20 Claims, 5 Drawing Sheets

(51) Int. Cl.
*H04N 5/3745* (2011.01)
*H04N 5/232* (2006.01)

(58) Field of Classification Search
CPC ......... H01L 27/14643–14663; H04N 5/23229; H04N 5/341; H04N 5/37452
See application file for complete search history.

(56) References Cited

U.S. PATENT DOCUMENTS

| | | | |
|---|---|---|---|
| 10,186,545 B2* | 1/2019 | Lee | H01L 27/14649 |
| 10,197,716 B2* | 2/2019 | Ockenfuss | G02B 1/10 |
| 2005/0249377 A1* | 11/2005 | Fouquet | G01J 3/10 |
| | | | 382/103 |
| 2013/0316487 A1* | 11/2013 | de Graff | H01L 27/14687 |
| | | | 438/66 |
| 2018/0007760 A1* | 1/2018 | Ollila | H04N 5/33 |
| 2019/0303640 A1* | 10/2019 | Song | G06K 9/0004 |
| 2020/0221166 A1* | 7/2020 | Park | H04N 21/4312 |

OTHER PUBLICATIONS

Inturu Omkaram et al., "Transition metal dichalcogenide photodetectors", Two-dimensional Materials for Photodetector, Chapter 2, Dec. 20, 2017, pp. 21-48.
Thomas Mueller et al., "Exciton physics and device application of two-dimensional transition metal dichalcogenide semiconductors", npj 2D Materials and Applications 2, Article No. 29 (Sep. 10, 2018).

* cited by examiner

TUNABLE IMAGING SYSTEMS AND METHODS THEREOF

TECHNICAL FIELD

The present disclosure generally relates to imaging systems and, more specifically, imaging systems having a tunable hyperspectral filter and methods for determining an intensity of radiation received by a pixel sensor.

BACKGROUND

Electromagnetic radiation (or just radiation) refers to waves of the electromagnetic field propagating (radiating) through space with respective wavelengths, frequencies, and energies. The range of frequencies of electromagnetic radiation is known as the electromagnetic spectrum, and includes electromagnetic waves with frequencies ranging from below one hertz to above 1025 hertz, corresponding to wavelengths from thousands of kilometers down to a fraction of the size of an atomic nucleus. This frequency range is divided into separate bands, and the electromagnetic waves within each frequency band are identified by respectively different names. Waves with long wavelengths (i.e., low frequency waves) include radio waves and microwaves, while waves with short wavelengths (i.e., high frequency waves) include X-rays and gamma rays.

An image sensor is able to detect electromagnetic radiation and convey information representing the detected radiation. For example, the image sensor may detect visible light and convey information representing an image. The image sensor may function by converting the waves of radiation into signals in the form of electrical current. Image sensors are used in electronic imaging devices such as digital cameras, camera modules, medical imaging equipment, thermal imaging devices, radar, and sonar, among numerous other examples.

SUMMARY

An embodiment of the present disclosure takes the of form of an imaging system including at least one tuner and an image sensor having a plurality of pixel sensors. Each pixel sensor includes a photodetector, a stack of two or more filter layers having a given transition metal dichalcogenide (TMD), and one or more transparent glass layers positioned between adjacent filter layers. The stack selectively transmits received radiation to the photodetector based on a transmissivity of the filter layers, the transmissivity is based at least in part on a tuning context of the at least one tuner. The imaging system further includes a processor and data storage having instructions that, when executed, cause the imaging system to set the tuning context of the tuner to a first tuning context and, for each of the pixel sensors, measure an intensity of radiation received from the filter layers by the photodetector, determine a transmissivity of the stack based on both (i) the given TMD and (ii) the tuning context, and determine an intensity of radiation received by the pixel sensor at the stack based on the measured intensity and the determined transmissivity.

A further embodiment takes the form of an imaging system including an image sensor and a pair of conductors. The image sensor includes a plurality of pixel sensors, and each pixel sensor includes a photodetector, a stack of two or more filter layers having a given transition metal dichalcogenide (TMD), and one or more transparent glass layers positioned between adjacent filter layers. The pair of conductors are positioned at opposite ends the stacks of filter layers of one or more of the pixel sensors of the image sensor. The stacks of filter layers selectively transmit received radiation to the photodetectors based on a respective transmissivity of the filter layers, and the transmissivity of the filter layers is based on (i) the given TMD of the respective filter layers and (ii) an electric field provided between the pair of conductors.

A further embodiment takes the form of a method of determining an intensity of radiation received by a pixel sensor. The method includes setting a tuning context of a tuner of a filter stack of the pixel sensor. The filter stack is positioned between a photodiode of the pixel sensor and a radiation source, and includes two or more filter layers having a given transition metal dichalcogenide (TMD). One or more transparent glass layers are positioned between adjacent filter layers in the filter stack. The method further includes receiving radiation at the filter stack from a radiation source and selectively transmitting the radiation received at the filter stack to a photodetector. The radiation is selectively transmitted based on a transmissivity of the filter layers of the filter stack. The method further includes measuring an intensity of radiation received by the photodetector from the filter stack, and determining the transmissivity of the filter stack based on both (i) the given TMD of the filter layers and (ii) the tuning context. The method further includes determining an intensity of the radiation received by the filter stack based on the measured intensity of radiation received by the photodetector and the determined transmissivity of the filter layers.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Figure 1:
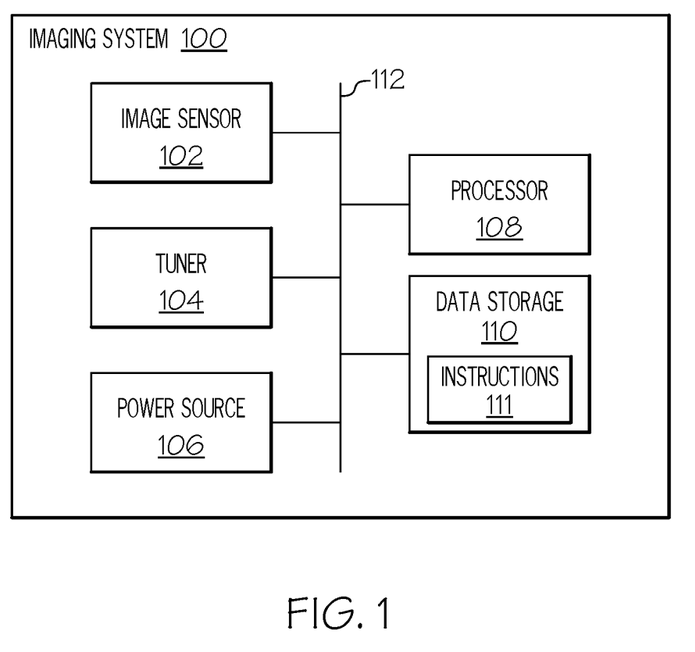
FIG. 1 depicts an imaging system, according to one or more embodiments shown and described herein.

FIG. 1 depicts an imaging system, according to one or more embodiments shown and described herein. As shown, an imaging system 100 includes an image sensor 102, a tuner 104, a power source 106, a processor 108, and a data storage 110, each of which are communicatively connected via a communication path 112. Those of skill in the art will appreciate that the imaging system 100 may include different and/or additional components without departing from the scope of the claims.

The image sensor 102 may include a plurality of pixel sensors configured to determine an intensity of radiation received by the respective pixel sensors. For example, radiation that strikes a respective pixel sensor of the image sensor 102 may be held as a small electrical charge in a photodetector of the pixel sensor that is then transferred through one or more output nodes to be converted to a voltage that represents an intensity of radiation received by the photodetector.

The tuner 104 may include conductors, heaters, or other components for tuning an absorption or transmissivity property of one or more filter layers of the image sensor 102 (e.g., respective filter layers of the pixel sensors of the image sensor). For example, the filter layers of the respective pixel sensors of the image sensor 102 may take the form of a respective monolayer transition metal dichalcogenide (TMD), and the absorption properties of the TMD can be modified or "tuned" using excitonic multiplication—e.g., by providing an electric field between the top and bottom TMD filter layers or by heating the TMD filter layers. The power source 106 may provide electrical current to the image sensor 102, the tuner 104, and/or other components of the imaging system 100 to, for example, provide the electric field to the TMD filter layers and/or heat the TMD filter layers.

The processor 108 may take the form of one or more general purpose processors (e.g., microprocessors) and/or one or more special purpose processors (e.g., application specific integrated circuits), and may be integrated in whole or in part with the data storage 110, the image sensor 102, and/or any other component or combination of components of the imaging system 100. The data storage 110 may include one or more volatile and/or non-volatile storage components, such as optical, magnetic, or flash memory. The data storage 110 (e.g., a non-transitory data storage) may include program instructions 111, which may be executable by processor 108 to carry out various imaging-system functions described herein.

Figure 2:
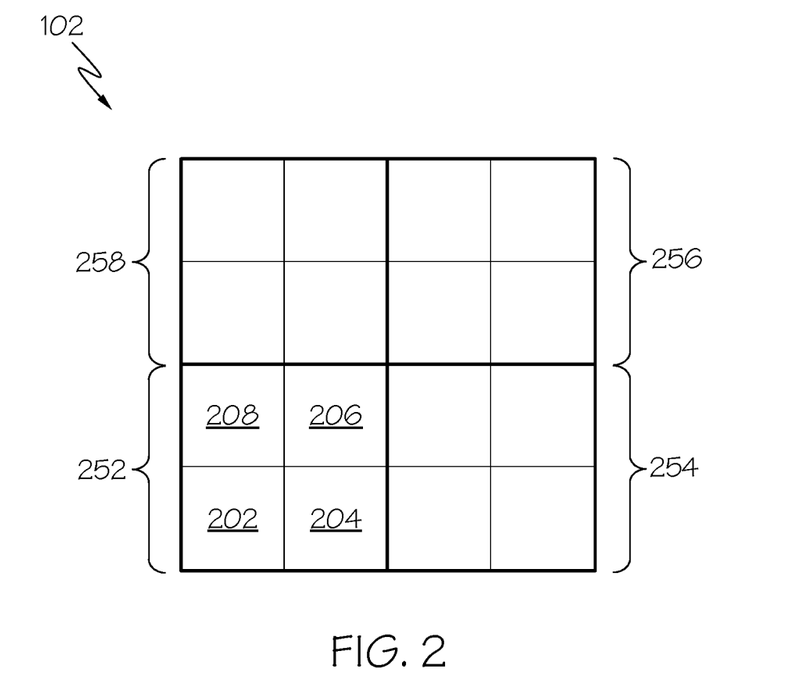
FIG. 2 depicts an image sensor of an imaging system, according to one or more embodiments shown and described herein.

FIG. 2 depicts an image sensor of the imaging system 100, according to one or more embodiments shown and described herein. As shown, the image sensor 102 includes a grid of pixel sensors, including pixel sensors 202, 204, 206, and 208. The image sensor 102 receives radiation from a radiation source, which could take the form of one or more radiation sources, and the radiation received by the image sensor 102 is received at the pixel sensors 202, 204, 206, and 208, as well as the other pixel sensors of the image sensor 102. Though the image sensor 102 is shown as including only sixteen pixel sensors, the image sensor 102 could contain additional and/or fewer pixel sensors. For example, the image sensor 102 could include thousands of pixel sensors.

The grid of pixel sensors in the embodiment of FIG. 2 takes the form of a square grid of pixel sensors (specifically, a 4×4 grid of pixel sensors). However, the grid of pixel sensors could take other forms as well, such as a 2×8 grid or a 1×16 grid. Though the image sensor 102 is shown as including only sixteen pixel sensors, the image sensor 102 could contain additional and/or fewer pixel sensors. For example, the image sensor 102 could include thousands of pixel sensors.

As shown, the pixel sensors of the image sensor 102 may be grouped into one or more sensor groups 252, 254, 256, and 258. For example, sensor group 252 includes pixel sensors 202, 204, 206, and 208. Additional aspects of the sensor groups 252, 254, 256, and 258 are described below.

Figure 3:
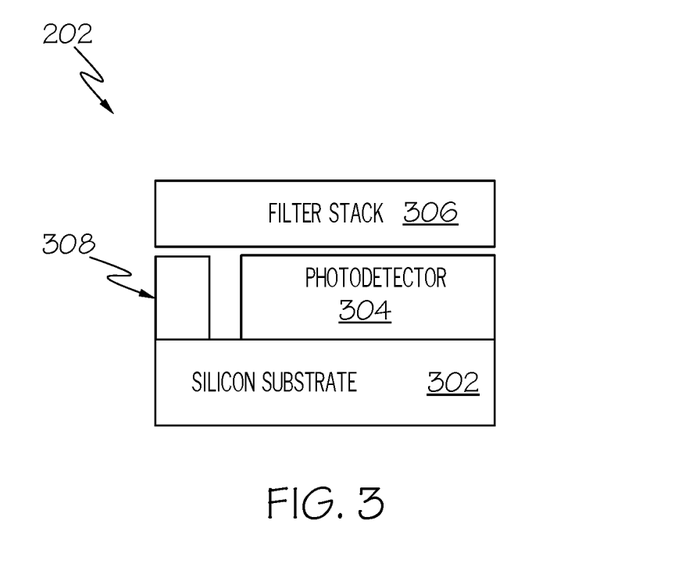
FIG. 3 depicts a pixel sensor of an image sensor, according to one or more embodiments shown and described herein.

FIG. 3 depicts a pixel sensor of the image sensor 102, according to one or more embodiments shown and described herein. As shown, the pixel sensor 202 includes a silicon substrate 302, a photodetector 304, a filter stack 306, and circuitry 308, and the pixel sensor 202 receives radiation from a radiation source at the filter stack 306. Those of skill in the art will appreciate that the pixel sensor 202 may include different and/or additional elements. For example, the pixel sensor 202 may further include one or more tuners, as discussed in additional detail below. Additionally, though FIG. 3 depicts the pixel sensor 202 for illustrative purposes, those of skill in the art will appreciate that any of the pixel sensors 204, 206, 208, and/or any other pixel sensors of image sensor 102 may take a form similar to (or identical to) the pixel sensor 202.

The silicon substrate 302 takes the form of a base upon which one or more components of the image sensor 102 are provided, and could include (for example) a substrate used in the production of CMOS and CCD image sensors, among other possibilities. Those of skill in the art will appreciate that the silicon substrate 302 may take other forms as well.

The photodetector 304 is arranged on the silicon substrate 302, though one or more additional components may be positioned between the photodetector 304 and the silicon substrate 302. The photodetector 304 may detect an intensity of radiation received at the photodetector 304, and could take the form of a photodiode, a photoelectro-magnetic photodetector, a photoemissive photodetector, a photovoltaic photodetector, and/or a fiber-optic photodetector, as examples.

The filter stack 306 is arranged adjacent to the photodetector 304 so that the filter stack 306 is positioned between the photodetector 304 and a radiation source. The pixel sensor 202 receives radiation from the radiation source at the filter stack 306, and the filter stack 306 selectively transmits the received radiation to the photodetector 304.

The circuitry 308 includes, for example, a bus to provide a readout integrated circuit with a voltage generated by the photodetector 304 based on an intensity of radiation received by the photodetector 304. The circuitry could also include (or form part or all of) a readout integrated circuit that receives voltages from one or more photodetectors (such as photodetector 304) to determine the intensity of radiation measured by the respective photodetectors. Additionally, the circuitry 308 may provide an electric field across the filter stack 306, as discussed in additional detail below. The circuitry 308 could take other forms as well without departing from the scope of the disclosure.

To selectively transmit the received radiation, the filter stack 306 obstructs at least some of the received radiation. For example, the filter stack 306 may obstruct radiation of a given wavelength, a range of wavelengths, multiple ranges of wavelengths, any combination of these, or all wavelengths, as examples. Obstructing the radiation may involve partially or completely reducing an intensity of radiation of a given wavelength, e.g., by absorbing some or all of the radiation of that wavelength. Any radiation received by the filter stack 306 that is not obstructed by the filter stack 306 is selectively transmitted to the photodetector 304.

The transmissivity of the filter stack 306 at a given wavelength represents the proportion of radiation of that wavelength that is not obstructed by the filter stack 306 but is instead selectively transmitted to the photodetector 304. A higher transmissivity at a given wavelength indicates that less radiation of that wavelength is obstructed by the filter stack 306, and a lower transmissivity indicates that more radiation of that wavelength is obstructed.

The intensity r(λ) of radiation at a given wavelength λ selectively transmitted by the filter stack 306 and received by the photodetector 304 may be represented as:

$$r(\lambda) = T(\lambda) \times b(\lambda) \quad \text{(eq. 1)}$$

where b(λ) the intensity of radiation of wavelength λ received by the filter stack 306 and T(λ) is the transmissivity of the filter stack 306 at wavelength λ. The transmissivity of the filter stack 306 at wavelengths $\lambda_1$ to $\lambda_n$ can be represented as $\hat{T} = [T(\lambda_1)\ T(\lambda_2)\ \ldots\ T(\lambda_n)]$. Accordingly, the total intensity r of all radiation selectively transmitted by the filter stack 306 and received by the photodetector 304 may be represented as:

$$r = \hat{T} \times \vec{b} = [T(\lambda_1)\ T(\lambda_2)\ \ldots\ T(\lambda_n)] \times \begin{bmatrix} b_p(\lambda_1) \\ b_p(\lambda_2) \\ \vdots \\ b_p(\lambda_n) \end{bmatrix} \quad \text{(eq. 2)}$$

for wavelengths $\lambda_1$ to $\lambda_n$ selectively transmitted by the filter stack 306. The intensity $\vec{b}$ of radiation of respective wavelengths $\lambda_1$ to $\lambda_n$ received by the pixel sensor 202 at the filter stack 306 can thus be represented as:

$$\vec{b} = r \times \hat{T}^{-1} \quad \text{(eq. 3)}$$

Radiation of a given wavelength can also be identified by the frequency or energy of the radiation. For instance, the frequency v of radiation of a given wavelength λ can be represented as v=c/λ, where c is the speed of light. Similarly, the energy E of radiation of a given wavelength λ can be represented as E=(h×c)/λ, where h is Planck's constant. Accordingly, though the present disclosure may contain references to radiation of a given wavelength, those of skill in the art will appreciate that radiation may be identified by any combination of frequency, energy, or wavelength without departing from the scope of the claims.

The filter stacks of the pixel sensors 202, 204, 206, and 208 may have respective transmissivities such that each filter stack may have a higher (or lower) transmissivity at a range of wavelengths corresponding to a given color in the visible spectrum (or other range of wavelengths). For example, the filter stack of pixel sensor 204 could have a higher (or lower) transmissivity at wavelengths in the range of 625-740 nm, generally corresponding to red light, as compared to the transmissivity of the filter stack at wavelengths outside of this range. Similarly, the filter stack of pixel sensor 206 could have a higher (or lower) transmissivity at wavelengths in the range of 500-565 nm generally corresponding to green light, and the filter stack of pixel sensor 208 could have a higher (or lower) transmissivity at wavelengths in the 450-485 nm generally corresponding to blue light. As another possibility, the filter stacks of the pixel sensors could have higher or lower transmissivities at wavelengths in the range of 700 nm to 1 mm (generally corresponding to infrared radiation) and/or 10 nm-400 nm (generally corresponding to ultraviolet radiation). Those of skill in the art will appreciate that any other wavelengths or ranges of wavelengths may be used without departing from the scope of the claims.

Figure 4:
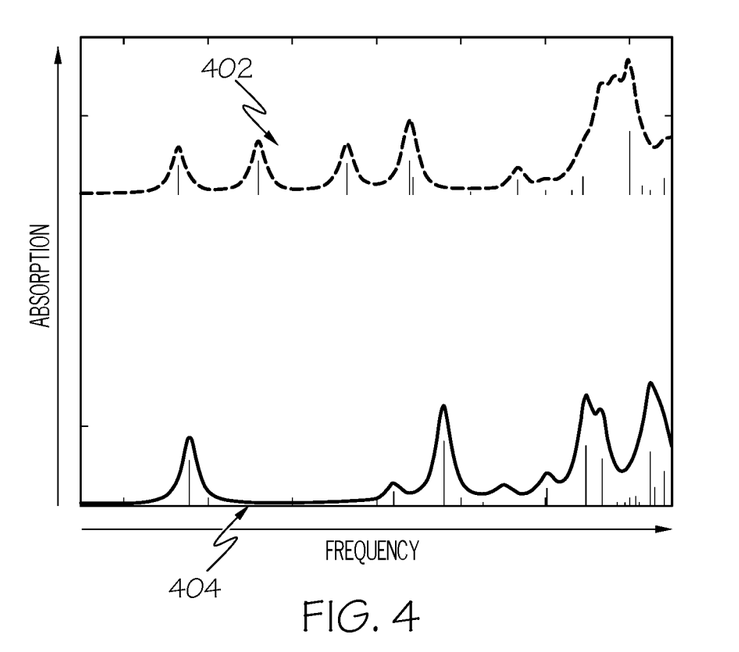
FIG. 4 depicts frequency responses of respective filter stacks, according to one or more embodiments shown and described herein.

FIG. 4 depicts frequency responses of respective filter stacks, according to one or more embodiments shown and described herein. An x-axis represents a given frequency of radiation received at a filter stack, and the y-axis represent an amount of absorption (by the filter stack) of the radiation of that frequency. Frequency response 402 and frequency response 404 represent respective amounts of absorption at given wavelengths by filter stacks the include respectively different materials. As shown, each frequency response may have a baseline amount of absorption. Each frequency response may also include a number of peaks, indicating higher amounts of absorption at those wavelengths. Absorption amounts may increase closer to these peaks.

The frequency response of a given filter stack may depend on the material of the filter layers in the given filter stack. For example, frequency response 402 may represent the frequency response of a filter stack with filter layers made of a first TMD, while frequency response 404 may represent the frequency response of a filter stack with filter layers made of WS2.

In an embodiment, the filter stack 306 includes two or more filter layers, as well as one or more transparent glass layers positioned between adjacent filter layers in the stack so that each filter layer is separated from adjacent filter layers by at least one of the one or more transparent glass layers. Each respective filter layer receives radiation from a radiation source or from an adjacent filter layer between the respective filter layer and the radiation source. Similarly, each respective filter layer selectively transmits radiation to the photodetector 304 or to an adjacent filter layer between the respective filter layer and the photodetector 304. Radiation selectively transmitted to an adjacent filter layer may be transmitted through one or more glass layers. To selectively transmit the received radiation, the filter layers obstruct at least some of the received radiation—e.g., by partially or completely reducing an intensity of radiation of a given wavelength, range of wavelengths, or ranges of wavelengths. Any radiation received by the filter layers that is not obstructed is selectively transmitted as described above. Accordingly, the transmissivity of the filter stack 306 at a given wavelength is based (at least in part) on the transmissivity of the respective filter layers of the filter stack 306.

Figure 5:
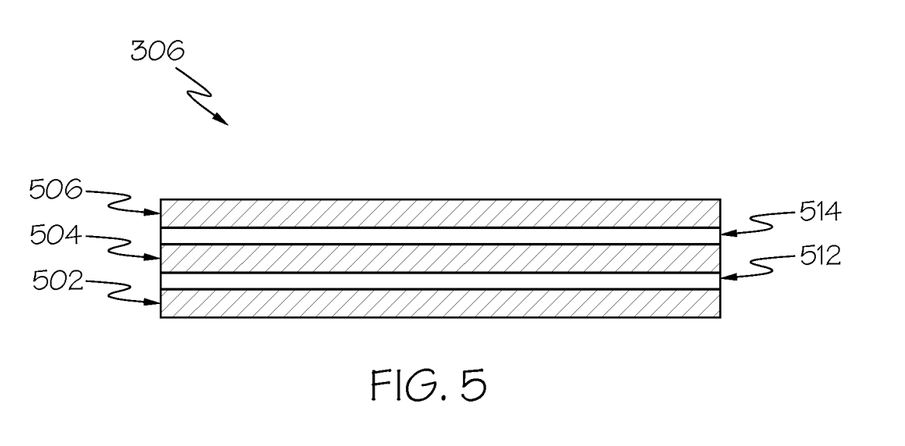
FIG. 5 depicts a filter stack of a pixel sensor, according to one or more embodiments shown and described herein.

FIG. 5 depicts a filter stack of the pixel sensor 202, according to one or more embodiments shown and described herein. As shown, the filter stack 306 includes filter layers 502, 504, and 506. The filter layers 502 are 504 are adjacent, and the filter layers 504 and 506 are adjacent. The filter layer 502 is the bottom filter layer of the filter stack 306 and is adjacent to photodetector 304; radiation selectively transmitted by the filter stack 506 to the photodetector 304 is transmitted from filter layer 502. The filter layer 506 is the top layer of the filter stack 306 (though top and bottom could be reversed), and the filter stack 306 receives radiation from a radiation source at the filter layer 506. Though FIG. 5 depicts three filter layers, those of skill in the art will understand that the filter stack 306 may include additional or fewer filter layers.

A transparent glass layer 512 is positioned between the adjacent filter layers 502 and 504 so that the filter layer 502 is separated from the filter layer 504 by the transparent glass layer 512. Similarly, a transparent glass layer 514 is positioned between the adjacent filter layers 504 and 506 so that the filter layer 504 is separated from the filter layer 506 by the transparent glass layer 514.

Filter layer 506 receives radiation from a radiation source and selectively transmits the received radiation through transparent glass layer 514 to filter layer 504. Filter layer 504 in turn receives radiation from filter layer 506 through transparent glass layer 514, and selectively transmits the received radiation through transparent glass layer 512 to filter layer 502. Finally, filter layer 502 receives radiation from filter layer 504 through transparent glass layer 512, and selectively transmits the received radiation to the photodetector 304.

In an embodiment, the transmissivity of filter layers 502, 504, and 506 at wavelength λ is given as $T_1(\lambda)$, $T_2(\lambda)$, and $T_3(\lambda)$, respectively. Filter layer 506 receives radiation with an intensity of $r_0(\lambda)$ at wavelength λ, and selectively transmits the received radiation with an intensity of $r_1(\lambda)=r_0(\lambda) \times T_1(\lambda)$ at wavelength λ to filter layer 504. Filter layer 504 in turn selectively transmits the received radiation with an intensity of $r_2(\lambda)=r_1(\lambda) \times T_2(\lambda)$ at wavelength λ to filter layer 502. Filter layer 502 selectively transmits the received radiation with an intensity of $r_3(\lambda)=r_2(\lambda) \times T_3(\lambda)$ at wavelength λ to the photodetector 304.

Each of the filter layers 502, 504, and 506 of the filter stack 306 may take the form of (or include) a monolayer transition metal dichalcogenide (TMD), which could be any one or more of a tungsten disulfide ($WS_2$) layer, a tungsten diselenide ($WSe_2$) layer, a molybdenum disulfide ($MoS_2$) layer, and a molybdenum diselenide ($MoSe_2$) layer. The transmissivity $\hat{T}=[T(\lambda_1) T(\lambda_2) \ldots T(\lambda_n)]$ of a TMD layer at one or more wavelengths $\lambda_1$ to $\lambda_n$ can be modified or "tuned" using excitonic multiplication, e.g., by providing an electric field between the top and bottom TMD layers of the filter stack 306, by heating the TMD layers and/or transparent glass layers between adjacent TMD layers, or a combination of these.

Figure 6A:
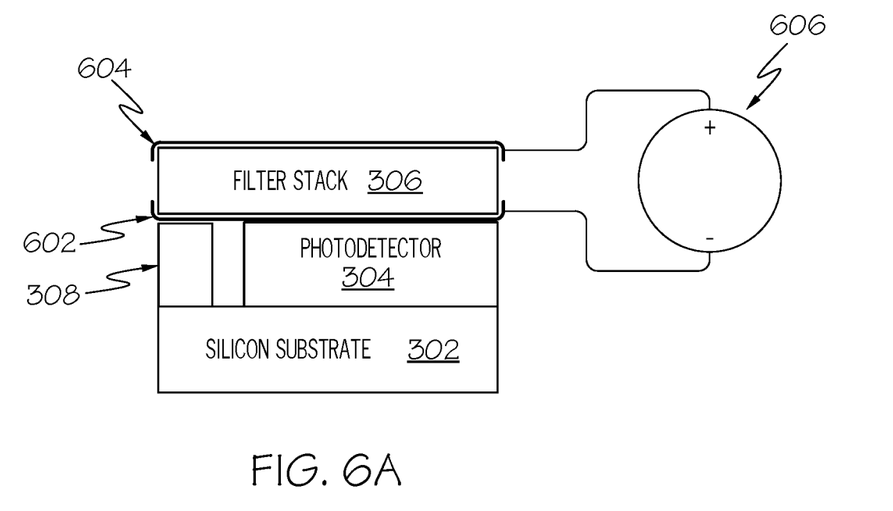
FIGS. 6A and 6B depict respective examples of a tuner of an imaging system, according to one or more embodiments shown and described herein.
Figure 6B:
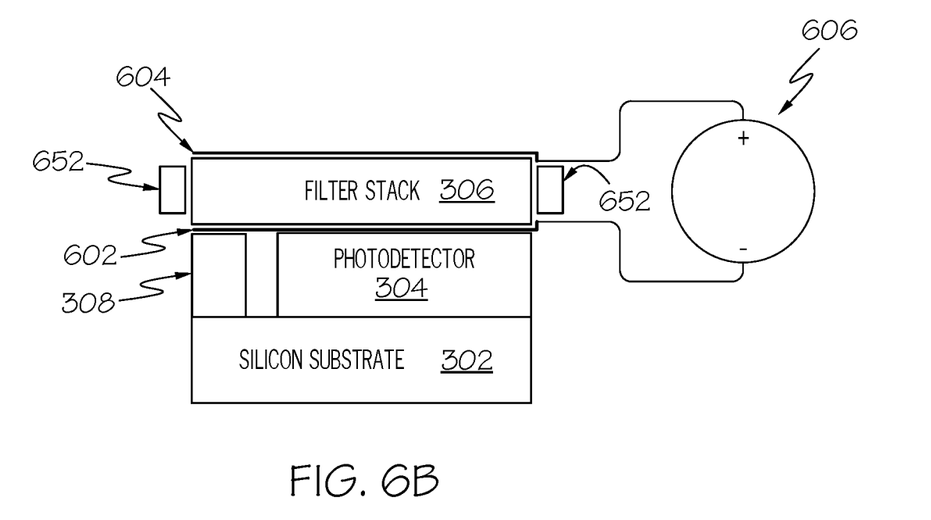

FIGS. 6A and 6B depict respective examples of the tuner 104 of the imaging system 100, according to one or more embodiments shown and described herein.

In the embodiment shown in FIG. 6A, a tuner includes a pair of conductors 602 and 604 positioned at opposite ends of the filter stack 306 of the pixel sensor 202. The conductor 602 is positioned on the bottom the filter stack 506 (e.g., on the bottom of bottom filter layer 502 shown in FIG. 5), and the conductor 604 is positioned on the top of the filter stack 306 (e.g., on the top of top filter layer 506). In the embodiment in FIG. 6A, tuning the filter stack 306 involves providing an electric field 606 between the pair of conductors 602 and 604—e.g., using the power source 106. The electric field generates excitons, which changes the absorption property of the stack over a range of wavelengths and thus changes the transmissivity of the filter stack 306. The imaging system 100 may be configured to provide the electric field between the pair of conductors 602 and 604, and a tuning context of the tuner 104 may be based on the electric field.

Either or both of the conductors 602 and 604 could take the form of transparent conductors, which could include, for example, one or more metals that are conductive but also transparent to radiation (e.g., optically transparent to light) of one or more wavelengths. For instance, the conductors could take the form of indium tin oxide (ITO), among other possibilities that will be known to those of skill in the art.

In an embodiment, the imaging system 100 includes a single pair of conductors 602 and 604 positioned at opposite ends of the filter stacks of all pixel sensors of the image sensor 102. In another embodiment, the imaging system 100 includes pairs of conductors for each if the sensor groups 252, 254, 256, and 258 of pixel sensors. For each sensor group, a respective pair of conductors is positioned at opposite ends of the filter stacks of the pixel sensors of the sensor group. In a further embodiment, the imaging system 100 includes pairs of conductors for each pixel sensor of the image sensor 102 and, for each pixel sensor, a respective pair of conductors is positioned at opposite ends of the filter stacks of the pixel sensors. Other examples are possible as well without departing from the scope of the claims.

In the embodiment shown in FIG. 6B, a tuner includes heating element 652, in addition to the conductors 602 and 604. The imaging system 100 could include a single heating element for the filter stacks of for all pixel sensors of the image sensor 102, respective heating elements for the each of the sensor groups 252, 254, 256, and 258 of the image sensor 102, and/or respective heating elements for each pixel sensor of the image sensor 102. The heating element 652 is configured to heat the filter stack 306, and could take the form of, for example, a heating collar or donut around the filter layers and/or transparent glass layers of one or more pixel sensors or sensor groups of the image sensor 102, among other possibilities. In the embodiment illustrated in FIG. 6B, tuning the filter stack 306 involves heating the filter stack 306 using heating element 652 (e.g., using the power source 106), in addition to providing an electric field between the pair of conductors 602 and 604. The imaging system 100 may be configured to heat the transparent glass layers 512 and 514 to a given temperature (e.g., using heating element 652), and a tuning context of the tuner 104 may be based on the given temperature.

Though FIG. 6B depicts the imaging system 100 as including both the conductors 602 and 604 and the heating element 652, it will be understood by those of skill in the art that the imaging system 100 may include the heating element 652 instead of the conductors 602 and 604, and that different and/or additional conductors, heaters, and/or tuners may be present.

Data identifying the respective TMD of the filter layers of each pixel sensor of the image sensor 102 may be stored in the data storage 110—e.g., in the form of Table 1 below.

TABLE 1

| Pixel Sensor | TMD | Tuner |
|---|---|---|
| 202 | $WS_2$ | $U_0$ |
| 204 | $WSe_2$ | $U_0$ |
| 206 | $MoS_2$ | $U_0$ |
| 208 | $MoSe_2$ | $U_0$ |
| ... | ... | $U_1$ |

As shown, data in the data storage 110 may further identify a tuner of each pixel sensor of image sensor 102—e.g., if the imaging system 100 includes more than one tuner. Additionally, data indicating the transmissivities of respective TMDs at respective tuning contexts may be stored in the data storage 110. For example, the data storage may include a table (such as Table 2 below) indicating the transmissivity of a filter stack for each wavelength, TMD, and tuning context.

TABLE 2

| Wavelength | TMD | Current | Transmissivity |
|---|---|---|---|
| $\lambda_1$ | $WS_2$ | $V_1$ | $T_0$ |
| $\lambda_1$ | $WS_2$ | $V_2$ | $T_1$ |
| $\lambda_1$ | $MoS_2$ | $V_1$ | $T_2$ |

TABLE 2-continued

| Wavelength | TMD | Current | Transmissivity |
|---|---|---|---|
| $\lambda_1$ | $MoS_2$ | $V_2$ | $T_3$ |
| $\lambda_2$ | $WS_2$ | $V_1$ | $T_4$ |
| ... | ... | ... | ... |
| $\lambda_m$ | $TMD_n$ | $V_p$ | $T_z$ |

Figure 7:
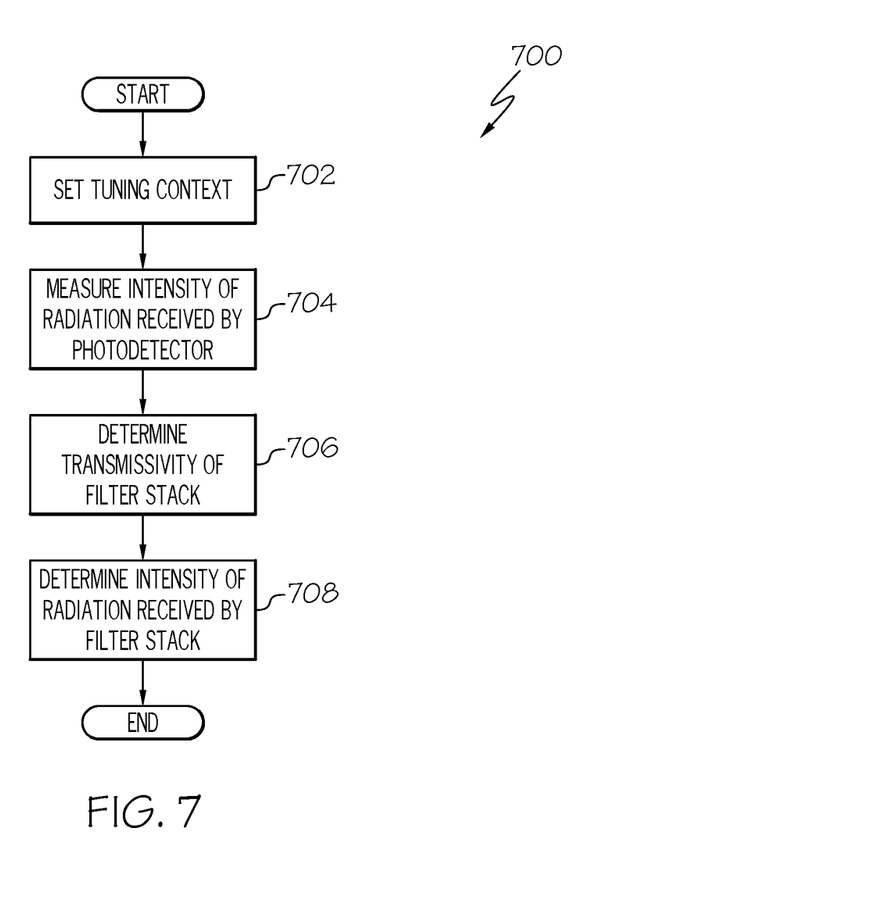
FIG. 7 depicts a flowchart of a method carried out by an imaging system, according to one or more embodiments shown and described herein.

FIG. 7 depicts a flowchart of a method carried out by the imaging system 100, according to one or more embodiments shown and described herein. As shown, method 700 begins at step 702 with the imaging system 100 setting a tuning context of the tuner 104. Setting the tuning context may involve setting an electric field 606 between conductors 602 and 604. Setting the tuning context may additionally or alternatively involve setting a temperature of heating element 652.

In an embodiment, the imaging system 100 sets a target wavelength (or range of wavelengths) of radiation for one or more of the pixel sensors of the image sensor 102 to detect, and setting the tuning context of the tuner 104 involves setting the tuning context based on the target wavelength. For example, to detect an intensity of radiation in a first range of wavelengths $\lambda_m$-$\lambda_n$, the imaging system 100 may set the tuner 104 to a first tuning context, and to detect an intensity of radiation in a second range of wavelengths $\lambda_m$-$\lambda_n$, the imaging system 100 may set the tuner 104 to a second tuning context.

In an embodiment, the imaging system 100 sets a respectively different target wavelength (or range of wavelengths) for each pixel sensor in a sensor group of the image sensor 102, and setting the tuning context of the tuner 104 involves setting the tuning context based on the respective target wavelengths. For example, the TMDs of the filter stacks of pixel sensors 202, 204, 206, and 208 of sensor group 252 may take the form of $WS_2$, $WSe_2$, $MoS_2$, $MoSe_2$, respectively. To detect an intensity of radiation of a first set of wavelengths $\lambda_a$, $\lambda_b$, $\lambda_c$, and $\lambda_d$ received at pixel sensors 202, 204, 206, and 208, respectively, where each of the wavelengths in the set are different from the others, the imaging system 100 may set the tuner 104 to a first tuning context. To detect an intensity of radiation of a second set of wavelengths $\lambda_e$, $\lambda_f$, $\lambda_g$, and $\lambda_h$ received at pixel sensors 202, 204, 206, and 208, respectively, where the second set of wavelengths is different from the first, the imaging system 100 may set the tuner 104 to a second tuning context.

In an embodiment, tuner 104 includes a respective tuner for each of a plurality of sensor groups. The filter layers of each pixel sensor in a given sensor group take the form of a given TMD different from the TMDs of the filter layers of the other pixel sensors in the sensor group. Each of the sensor groups have the same combination of filter layer TMDs for the pixel sensors in the respective groups. In a further such embodiment, the imaging system 100 sets a respectively different target wavelength for each pixel sensor in the sensor groups to detect, and setting the tuning context of the respective tuners involves setting the tuning context based on the respective target wavelengths.

For example, the imaging system 100 may include a first, second, third, and fourth tuner for sensor groups 252, 254, 256, and 258 respectively, The TMDs of the filter stacks of pixel sensors 202, 204, 206, and 208 of sensor group 252 may take the form of $WS_2$, $WSe_2$, $MoS_2$, and $MoSe_2$, respectively. The pixel sensors of sensor groups 254, 256, and 258 may include the same combination of filter layer TMDs as the pixel sensors of sensor group 252. The imaging system 100 may set a respectively different target wavelength for each of the pixel sensors in the sensor groups 252, 254, 256, and 258, and the imaging system may set the tuning contexts of the tuners for the sensor groups to a first, second, third, and fourth tuning context, respectively.

Setting the tuning context may involve obtaining, from the data storage 110, an indication of a given TMD and/or a tuner of the filter layers of one or more respective pixel sensors of the image sensor 102 and setting the tuning context based on the obtained indication. For example, the imaging system may obtain such an indication from a table (e.g., in the form of Table 1) stored in the data storage 110. Additionally or alternatively, setting the tuning context may involve obtaining an indication of a transmissivity for a given wavelength of radiation based on a given TMD and/or prospective tuning context. As another possibility, setting the tuning context may involve obtaining an indication of a prospective tuning context and/or given TMD based on a given wavelength of radiation or transmissivity for a given wavelength of radiation. For instance, the imaging system 100 may obtain such indications from a table (e.g., in the form of Table 2) stored in the data storage 110. The imaging system 100 may then set the tuning context based on the obtained indication or indications.

At step 704, the imaging system 100, for each of the pixel sensors of the image sensor 102, measures an intensity of radiation received by the photodetector 304 from the filter stack 306. Measuring the intensity of the received radiation could involve, for example, measuring a voltage of the respective photodetector, as described above.

At step 706, the imaging system 100, for each of the pixel sensors of the image sensor 102, determines a transmissivity of the filter stack of the pixel sensor. The imaging system 100 may determine the transmissivity of the filter stack based on the given TMD of the filter layers of the respective filter stack and the tuning context of tuner 104 set at step 702.

In an example, the imaging system 100 sets the tuning context of the tuner 104 to $TC_1$ at step 702 by setting an electric field between conductors 602 and 604 to $V_1$. To determine the transmissivity of pixel sensor 202, the imaging system 100 references Table 1 stored in the data storage 110 to determine that the TMD of the filter stack of pixel sensor 202 is $WS_2$ and that the tuner of the filter stack is tuner 104 (represented as $U_0$ in Table 1). The imaging system obtains, from Table 2 stored in the data storage 110, transmissivities $T_{202}(\lambda_1-\lambda_m)=[T_0\ T_4\ \ldots\ T_z]$ for a filter stack with a TMD of $WS_2$ and an electric field of $V_1$ between conductors 602 and 604 of the tuner 104.

In a further example, to determine the transmissivity of pixel sensor 206, the imaging system 100 references Table 1 in data storage 110 to determine that the TMD of the filter stack of pixel sensor 206 is $MoS_2$ and that the tuner of the filter stack is tuner 104 (represented as $U_0$ in Table 1). The imaging system obtains, from Table 2 in the data storage 110, transmissivities $T_{206}(\lambda_1-\lambda_m)=[T_2\ \ldots\ T_z]$ for a filter stack with a TMD of $MoS_2$ and an electric field of $V_1$ between conductors 602 and 604 of the tuner 104.

In embodiments where the tuner 104 includes multiple tuners, determining the transmissivity of the filter stack of a given pixel sensor may involve obtaining, from the data storage 110 (such as a Table 1 stored in the data storage), an identification of a respective tuner of the pixel sensor. The imaging system 100 may determine the transmissivity based on the tuning context of the identified tuner as set at step 702.

At step 708, the imaging system 100, for each of the pixel sensors of the image sensor 102, determines an intensity of the radiation received by the pixel sensor at the filter stack. The imaging system may determine the intensity based on an intensity of radiation measured at step 704 for a respective pixel sensor and the transmissivity of the respective pixel sensor determined at step 706.

The total intensity $\hat{r}_p$ of all radiation selectively transmitted by the filter stacks of the image sensor 102 and received by the photodetectors may be represented as:

$$\hat{r}_p = \hat{T} \times \vec{b}_p = \begin{bmatrix} r_p(C_1, tc_1) \\ r_p(C_2, tc_1) \\ \vdots \\ r_p(C_n, tc_1) \\ r_p(C_1, tc_2) \\ \vdots \\ r_p(C_m, tc_0) \end{bmatrix} = \begin{bmatrix} T(\lambda_1, C_1, tc_1) & \cdots & T(\lambda_n, C_1, tc_1) \\ \vdots & \ddots & \vdots \\ T(\lambda_1, C_m, tc_0) & \cdots & T(\lambda_n, C_m, tc_0) \end{bmatrix} \begin{bmatrix} b_p(\lambda_1) \\ \vdots \\ b_p(\lambda_n) \end{bmatrix} \quad \text{(eq. 4)}$$

where $C_n$ represents a given pixel sensor, $\lambda_n$ represents a given wavelength, $tc_n$ represents a given tuning context, $T(\lambda_n, C_n, tc_n)$ represents a transmissivity of a given pixel sensor at given wavelength and tuning context, and $b_p(\lambda_n)$ represents at intensity of radiation received at a filter stack of a given pixel sensor. The intensity of radiation received by the filter stack may thus be represented as:

$$\vec{b}_p = \hat{r}_p \times \hat{T}^{-1} \quad \text{(eq. 5)}$$

Determining the intensity of the radiation received by the pixel sensor at the filter stack may involve determining the intensity of radiation of a target wavelength (or range of wavelengths) received by the filter stack. The target wavelength may be set as described above with reference to step 702, for example. Additionally, in some embodiments, the imaging system 100 can further increase a number of target wavelengths for a given set of pixel sensors using estimation techniques. For example, based on a distribution of sunlight, indoor lights, and/or other physics, additional target frequencies can be determined with small error.

Accordingly, in an embodiment of an imaging system having (i) an image sensor with four sensor groups, each including four pixel sensors with filter layers of $WS_2$, $WSe_2$, $MoS_2$, $MoSe_2$ (respectively), and (ii) respective tuners for each of the groups set to respectively different tuning contexts, it is possible to determine the intensities of sixteen different wavelengths (or ranges of wavelengths) of radiation. In an example, four pixel sensors have filter layers of respectively different TMDs. The imaging system sets the tuning context of a tuner of the filter stacks of all four pixel sensors to a first tuning context, and measures the respective intensities of radiation received from the filter layers by the photodetectors of the pixel sensors. The imaging system determines the transmissivities of the filter layers based on the respective TMDs of the filter layers and based on the tuning context of the tuner of the filter stacks of all four pixel sensors being a first tuning context. Based on the measured intensities and the determined transmissivities, the imaging system determines the intensity of radiation of four different wavelengths of radiation received by the pixel sensors. The imaging system then sets the tuning context of the tuner to a second tuning context, and repeats the process of measuring the radiation received by the photodetectors and determining the transmissivities of the filter layers (based at least in part on the second tuning context). The imaging system determines an intensity of radiation of an additional four different wavelengths of radiation based on the TMDs and the determined transmissivities when the tuner is set to the second tuning context. In a similar manner, the imaging system determines an intensity of radiation of four different wavelengths when the tuner is set to a third tuning context, and another four wavelengths when the tuner is set to a fourth tuning context, resulting in determined intensities of radiation of sixteen different wavelengths.

Estimation techniques may be used to determine an intensity of radiation of a wavelength (or range of wavelengths) other than the respective target wavelengths of one or more of the pixel sensors of image sensor 102. For instance, an intensity of radiation between the respective target wavelengths of two different pixel sensors may be determined using such estimation techniques. As one possibility, the imaging system may estimate an intensity of radiation of a wavelength other than a target wavelength based on the respective frequency responses of filter stacks (i) at different tuning contexts and (ii) containing different TMDs. As another possibility, the imaging system may (additionally or alternatively) estimate an intensity of radiation other than a target wavelength by obtaining a measured intensity of sunlight (or other radiation) from a photodiode other than those of the pixel sensors, and estimating a contribution of sunlight to the intensities of radiation measured by the photodetectors of the pixel sensors. To obtain the estimated intensities of radiation, the imaging system may solve for a matrix inversion (e.g., an ill-defined matrix inversion), potentially based on one or more of the equations above. Possible estimation techniques include Bayesian estimation and Monte Carlo estimation, among others. Applying these estimation techniques to the example above, the imaging system may be able to increase, from sixteen to possibly twenty or more, the number of wavelengths of which the imaging system can determine the intensities of radiation.

It will be understood by those of skill in the art that various alternatives of the above-described aspects and embodiments may be used without departing from the scope of the claims. For example, tuner 104 may take the form of a single tuner or a plurality of tuners. The imaging system could include a respective tuner for each sensor group of the image sensor, a respective tuner for each pixel sensor of the image sensor, and/or any combination of these.

The given TMD of the filter layers of a given filter stack may include a same TMD. For example, each of the filter layers may include $WS_2$, and/or each may include $WSe_2$, among other possibilities. The filter layers may or may not include other TMDs or materials in addition to the same TMD.

The filter layers of a given stack may consist of the same TMD—that is, each filter layer may take the form of the same TMD as the other filter layers. As another possibility, the filter layers may consist of the same combination of TMDs such that each filter layer takes the form of the same combination of TMDs as the other filter layers. In still another example, the filter layers may consist of the same combination of materials (which could include one or more TMDs).

It should now be understood that embodiments described herein provide an image sensor with a tunable filter stack and systems for determining an intensity of radiation received by one or more pixel sensors of the image sensor based on a transmissivity of the tunable filter stack. By tuning the transmissivity of the filter stack using excitonic multiplication, it is possible to determine an intensity of radiation of multiple wavelengths.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An imaging system comprising:
at least one tuner; and
an image sensor comprising a plurality of pixel sensors, each pixel sensor comprising:
a photodetector;
a stack of two or more filter layers comprising a given transition metal dichalcogenide (TMD);
one or more transparent glass layers positioned between adjacent filter layers;
a processor; and
data storage comprising instructions that, when executed by the processor, cause the imaging system to:
set the tuning context of the tuner to a first tuning context; and
for each of the pixel sensors:
measure an intensity of radiation received from the filter layers by the photodetector;
determine a transmissivity of the filter layers based on both (i) the given TMD and (ii) a the tuning context of the tuner;
determine an intensity of radiation received by the pixel sensor at the stack of the filter layers based on the measured intensity and the determined transmissivity.

2. The imaging system of claim 1, wherein the given TMD of the filter layers of a respective pixel sensor comprises one of tungsten disulfide ($WS_2$), tungsten diselenide ($WSe_2$), molybdenum disulfide ($MoS_2$), and molybdenum diselenide ($MoSe_2$).

3. The imaging system of claim 1, wherein the given TMD of the filter layers of each respective pixel sensor of the image sensor is different from the given TMD of the filter layers of at least one other pixel sensor of the image sensor.

4. The imaging system of claim 3, wherein:
the given TMD of the filter layers of a first pixel sensor of the image sensor comprises $WS_2$.
the given TMD of the filter layers of a second pixel sensor of the image sensor comprises $WSe_2$.
the given TMD of the filter layers of a third pixel sensor of the image sensor comprises $MoS_2$. and
the given TMD of the filter layers of a fourth pixel sensor of the image sensor comprises $MoSe_2$.

5. The imaging system of claim 1, wherein the at least one tuner comprises a pair of conductors positioned at opposite ends the filter layers of one or more of the pixel sensors.

6. The imaging system of claim 5, wherein the imaging system is configured to provide an electric field between the pair of conductors, wherein the first tuning context is based on the electric field.

7. The imaging system of claim 1, wherein the at least one tuner comprises a heating collar around the transparent glass layers of one or more of the pixel sensors.

8. The imaging system of claim 1, wherein the imaging system is configured to heat the transparent glass layers of the one or more pixel sensors to a given temperature, wherein the first tuning context is based on the given temperature.

9. The imaging system of claim 1, wherein:
the imaging system further comprises a data storage including data indicating the respective given TMD of the filter layers of each of the pixel sensors, and
the instructions that cause the imaging system to determine the transmissivity for each of the pixel sensors based on the given TMD and the tuning context comprise instructions that cause the imaging system to obtain an indication of the given TMD from the data storage and determining the transmissivity based on both the obtained indication and the tuning context.

10. An imaging system comprising:
an image sensor comprising a plurality of pixel sensors, each pixel sensor comprising:
a photodetector;
a stack of two or more filter layers comprising a given transition metal dichalcogenide (TMD); and
one or more transparent glass layers positioned between adjacent filter layers; and
a pair of conductors positioned at opposite ends of the stacks of filter layers of one or more of the pixel sensors of the image sensor,
wherein the stacks of filter layers selectively transmit received radiation to the photodetectors based on a respective transmissivity of the filter layers, and
wherein the transmissivity of the filter layers is based on (i) the given TMD of the respective filter layers and (ii) an electric field provided between the pair of conductors.

11. The imaging system of claim 10, wherein the transmissivity of the filter layers is further based on a heating of the transparent glass layers.

12. The imaging system of claim 10, wherein the given TMD comprises one of tungsten disulfide ($WS_2$), tungsten diselenide ($WSe_2$), molybdenum disulfide ($MoS_2$), and molybdenum diselenide ($MoSe_2$).

13. The imaging system of claim 10, further comprising:
a processor; and
data storage comprising instructions that, when executed by the processor, cause the imaging system to:
measure a respective intensity of radiation received from the filter layers by the photodetectors of each of the pixel sensors;

determine the respective transmissivity of the filter layers of each of the pixel sensors; and determine a respective intensity of radiation received by each of the pixel sensors at the stacks of the filter layers based on the measured intensities and the determined transmissivities.

14. A method of determining an intensity of radiation received by a pixel sensor, the method comprising:

setting a tuning context of a tuner of a filter stack of the pixel sensor, the filter stack being positioned between a photodiode of the pixel sensor and a radiation source, wherein the filter stack includes two or more filter layers comprising a given transition metal dichalcogenide (TMD), wherein one or more transparent glass layers are positioned between adjacent filter layers in the filter stack;

receiving radiation at the filter stack from a radiation source;

selectively transmitting the radiation received at the filter stack to a photodetector, wherein the radiation is selectively transmitted based on a transmissivity of the filter layers of the filter stack;

measuring an intensity of radiation received by the photodetector from the filter stack;

determining the transmissivity of the filter stack based on both (i) the given TMD of the filter layers and (ii) the tuning context; and determining an intensity of the radiation received by the filter stack based on the measured intensity of radiation received by the photodetector and the determined transmissivity of the filter layers.

15. The method of claim 14, wherein the given TMD comprises one of tungsten disulfide ($WS_2$), tungsten diselenide ($WSe_2$), molybdenum disulfide ($MoS_2$), and molybdenum diselenide ($MoSe_2$).

16. The method of claim 14, wherein the tuner comprises a pair of conductors positioned at opposite ends the filter stack.

17. The method of claim 16, wherein setting the tuning context of the tuner comprises providing a first electric field between the pair of conductors.

18. The method of claim 14, wherein the tuner comprises a heating collar around the transparent glass layers.

19. The method of claim 14, wherein setting the tuning context of the comprises heating the transparent glass layers.

20. The method of claim 14, wherein determining the transmissivity of the filter stack based on both the given TMD of the filter layers and the tuning context comprises obtaining an indication of the given TMD from a data storage and determining the transmissivity of the filter stack based on the obtained indication and the tuning context.

* * * * *

UNITED STATES PATENT AND TRADEMARK OFFICE
CERTIFICATE OF CORRECTION

PATENT NO. : 10,950,638 B2
APPLICATION NO. : 16/370273
DATED : March 16, 2021
INVENTOR(S) : Paul Schmalenberg Page 1 of 1

It is certified that error appears in the above-identified patent and that said Letters Patent is hereby corrected as shown below:

In the Claims

In Column 13, Line(s) 53, Claim 1, before "tuning", delete "the".

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*